(12) United States Patent
Chen (10) Patent No.: US 7,612,992 B2
(45) Date of Patent: Nov. 3, 2009

(54) COOLING DEVICE FOR MEMORY CHIPS

(75) Inventor: Wei-Hau Chen, Taipei County (TW)

(73) Assignee: CompTake Technology Inc., Taipei County ( * ) Notice: Subject to any disclaimer, the term of this patent is extended or adjusted under 35 U.S.C. 154(b) by 103 days.

(21) Appl. No.: 11/889,670

(22) Filed: Aug. 15, 2007

(65) Prior Publication Data

US 2009/0034183 A1 Feb. 5, 2009

(30) Foreign Application Priority Data

Aug. 1, 2007 (TW) .............................. 96212616 U (51) Int. Cl.
G06F 1/16 (2006.01)
(52) U.S. Cl. ................. 361/679.31; 165/80.3; 257/719; 438/106; 310/64

(58) Field of Classification Search ................ 165/80.3, 165/185; 257/719; 361/704, 707, 708, 679–687, 361/724–727
See application file for complete search history.

(56) References Cited

U.S. PATENT DOCUMENTS 5,087,964 A * 2/1992 Hatta .......................... 257/680
7,312,966 B2 * 12/2007 Lee .............................. 361/56

* cited by examiner

*Primary Examiner*—Hung V Duong (57) ABSTRACT

A cooling device for memory chip includes a first part and a second part which is pivotably connected to the first part at a top thereof. Each of the first and second parts includes an elongate plate and fins extend from each of the elongate plates. Ventilation holes are defined through each the elongate plates and located between the fins. The memory chip is sandwiched between the first and second elongate plates of the first and second parts, and the fins of the two parts are arranged alternatively.

3 Claims, 8 Drawing Sheets

FIG.8
Prior Art

COOLING DEVICE FOR MEMORY CHIPS

BACKGROUND OF THE INVENTION (1) Field of the Invention

The present invention relates to a cooling device for memory chips and includes two parts which are pivotably connected to each other and the chip is sandwiched between the two parts.

(2) Description of the Prior Art

Figure 8:
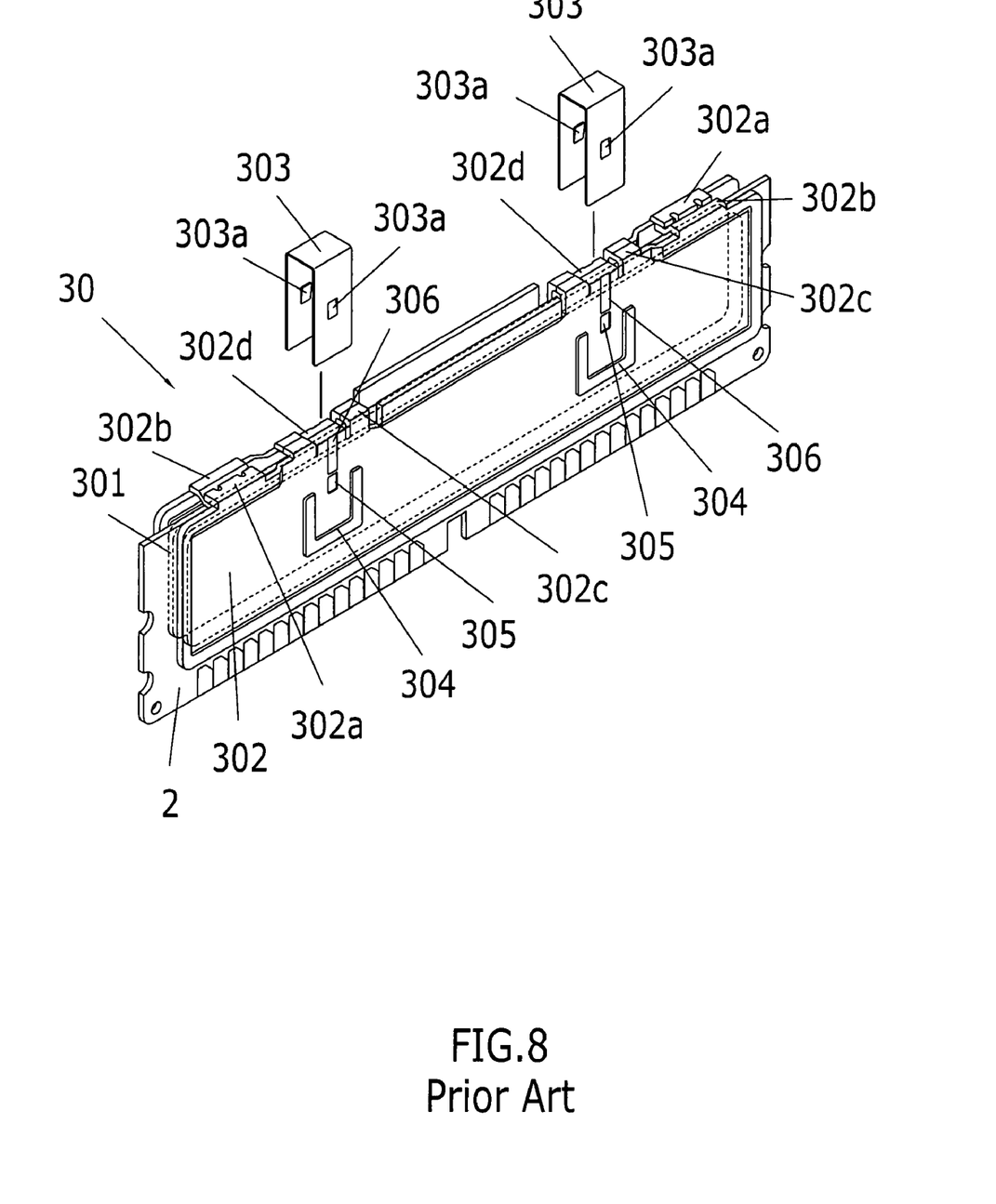
FIG. 8 is an exploded view to show a conventional cooling device for memory chips.

A conventional memory chip cooling device 30 is shown in FIG. 8 and generally includes two heat conductive plastic plates 301, two cooling plates 302 and two clamps 303, wherein the two heat conductive plastic plates 301 are attached to two respective insides of the two cooling plates 302. A hook 302a, a hole 302b and a frame 302c are connected on a top edge of each of the cooling plates 302 so as to connect the two cooling plates 302. The memory chip 2 is positioned in a space between the two cooling plates 302. The two frames 302c each have a positioning plate 302d on a top thereof and which is located corresponding to a U-shaped slot 304 defined in an outside of the cooling plate 302. An engaging hole 305 is defined and located above the slot 304 and a guide hole 306 is defined above the engaging hole 305 so that the two clamps 303 can mount to the positioning plates 302d and two hooks 303a on two respective insides of each clamp 303 are moved along the guide holes 306 and engaged with the engaging holes 305 to securely clamp the memory chip 2.

It is obvious that the structure for the cooling device includes too many tiny portions such as the U-shaped slot 304, the engaging hole 305, the guide hole 306 and the hooks 303a. This increases time required to assemble all of the parts. Besides, when disengaging the cooling device, the tiny portions are easily broken.

The present invention intends to provide a cooling device for memory chips and includes only two parts which are pivotably connected to each other and the memory chip is sandwiched between the two parts. Each part includes ventilation holes and/or fins to increase efficiency for removing heat from the memory chip.

SUMMARY OF THE INVENTION

The present invention relates to a cooling device for memory chip and the device comprises a first part having a first elongate plate and a first flange extends laterally from a top of the first elongate plate. A groove is defined in an edge of the first flange. A second part includes a second elongate plate and a second flange extends laterally from a top of the second elongate plate. A lip end is connected to an edge of the second flange. The lip end is pivotably engaged with the groove. A memory chip is sandwiched between the first and second elongate plates of the first and second parts.

The primary object of the present invention is to provide a memory chip cooling device that includes only two parts which are pivotably connected to each other so that the chip is easily sandwiched between the first and second parts, and easily removed from the first and second parts.

The present invention will become more obvious from the following description when taken in connection with the accompanying drawings which show, for purposes of illustration only, a preferred embodiment in accordance with the present invention.

DETAILED DESCRIPTION OF THE PREFERRED EMBODIMENTS

Figure 1:
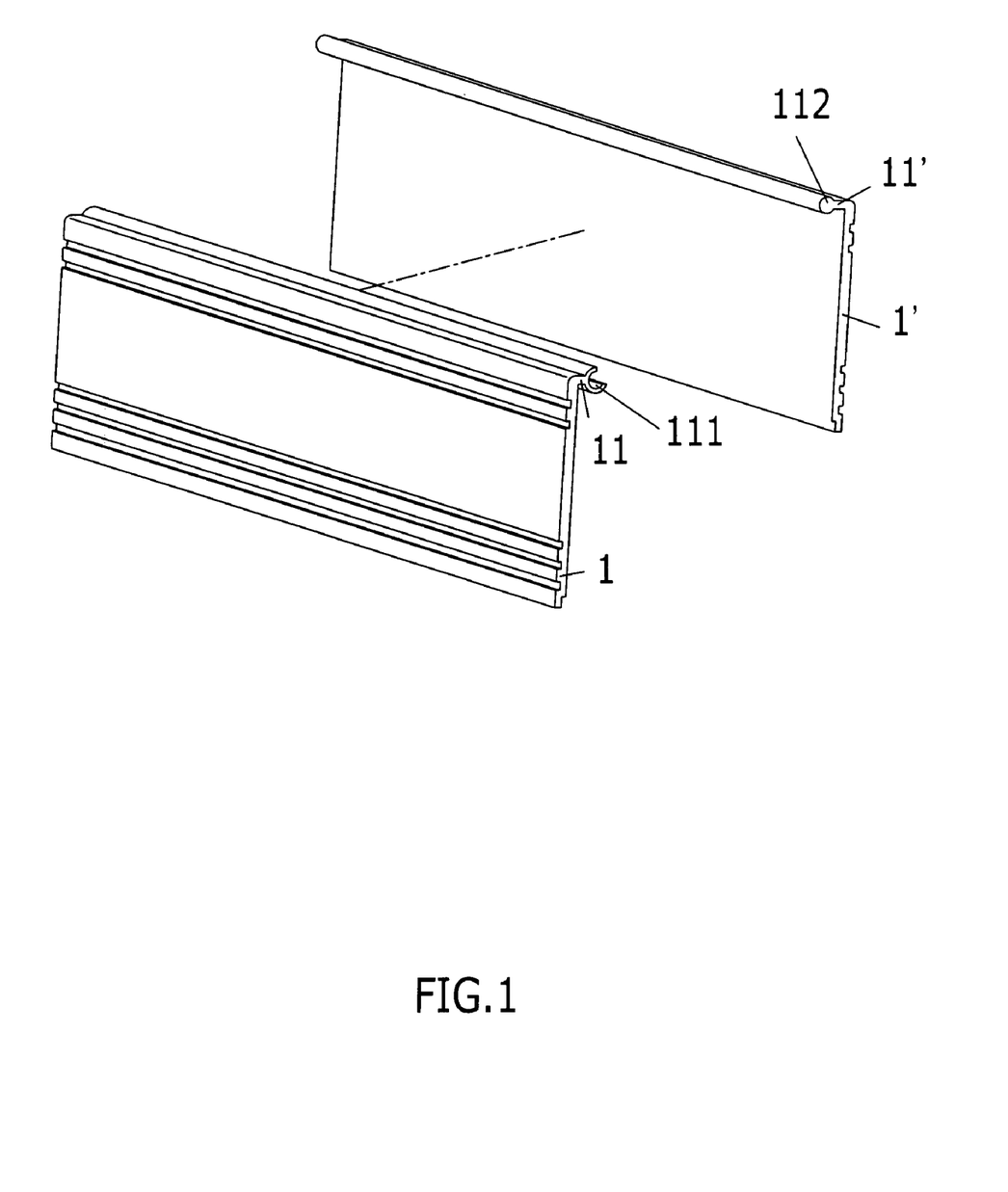
FIG. 1 is an exploded view to show the first and second parts of the cooling device of the present invention.
Figure 2:
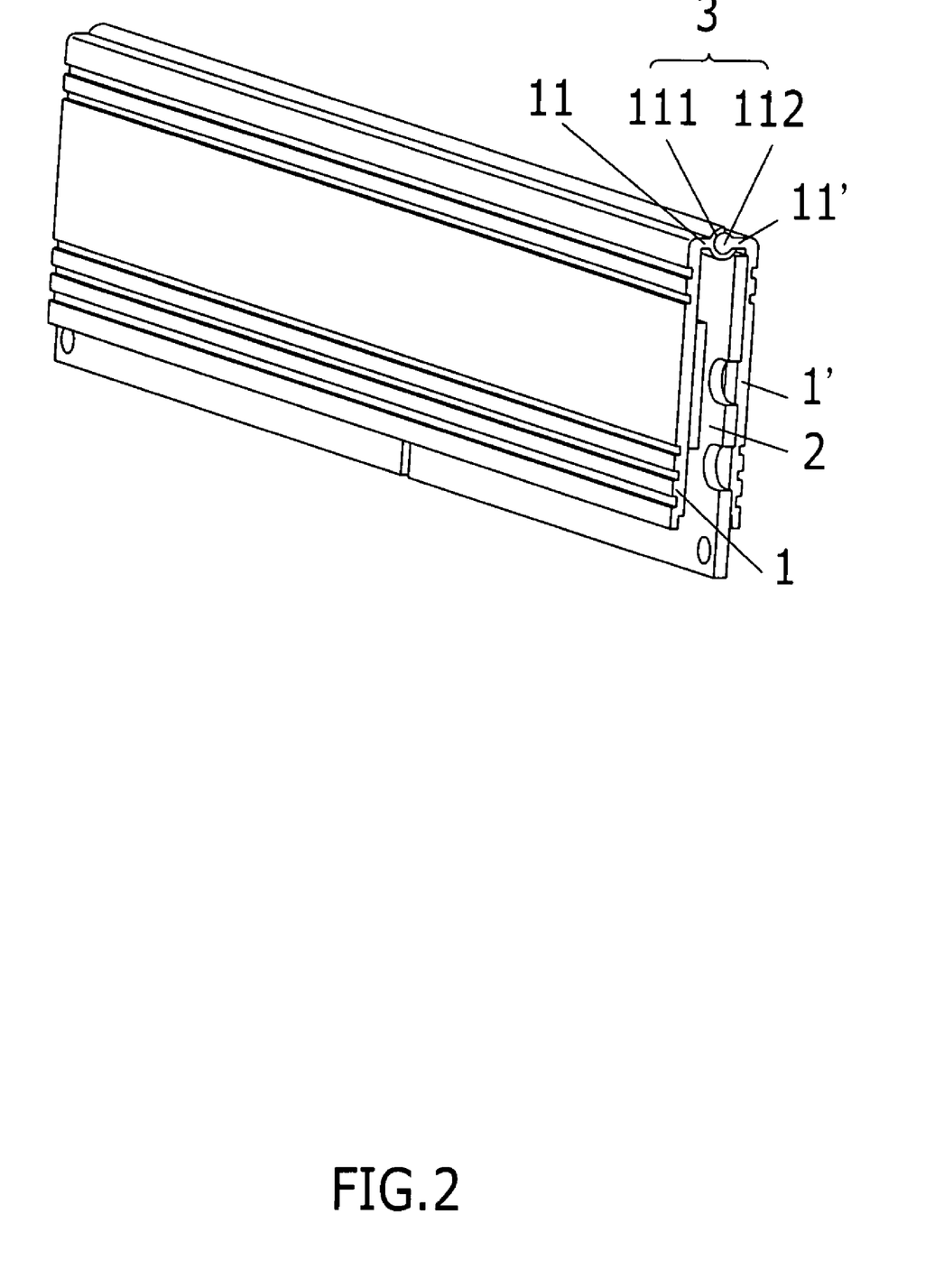
FIG. 2 is a perspective view to show a memory chip is sandwiched between the first and second parts of the present invention.
Figure 3:
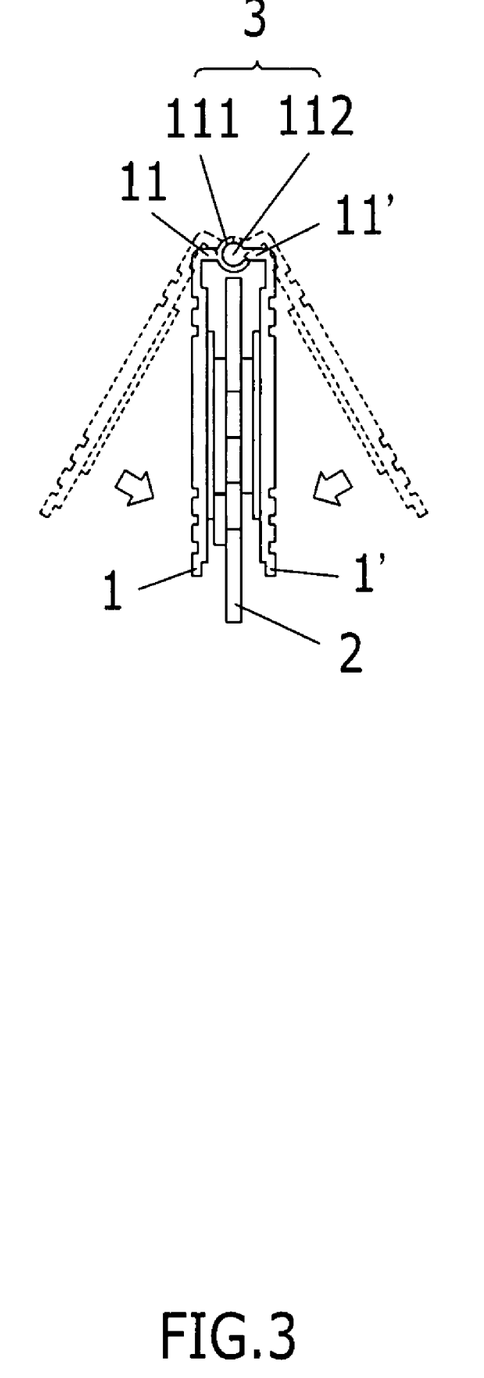
FIG. 3 shows that the first and second parts are pivoted toward each other.

Referring to FIGS. 1 to 3, the cooling device for memory chips of the present invention comprises a first part 1 and a second part 1' which is pivotably connected to the first part 1 by a pivot assembly 3. The first part 1 includes a first elongate plate and a first flange 11 extends laterally from a top of the first elongate plate. A groove 111 is defined in an edge of the first flange 11. The second part 1' includes a second elongate plate and a second flange 11' extends laterally from a top of the second elongate plate. A lip end 112 is connected to an edge of the second flange 11' and pivotably engaged with the groove 111. The pivot assembly 3 is composed of the groove 111 and the lip end 112. A memory chip 2 is sandwiched between the first and second elongate plates of the first and second parts 1, 1' such that the heat generated from the memory chip 2 is released via the first and second parts 1, 1'. As shown in FIG. 3, the first and second parts 1, 1' can be pivoted about the lip end 112 when installing or removing the memory chip 2.

Figure 4:
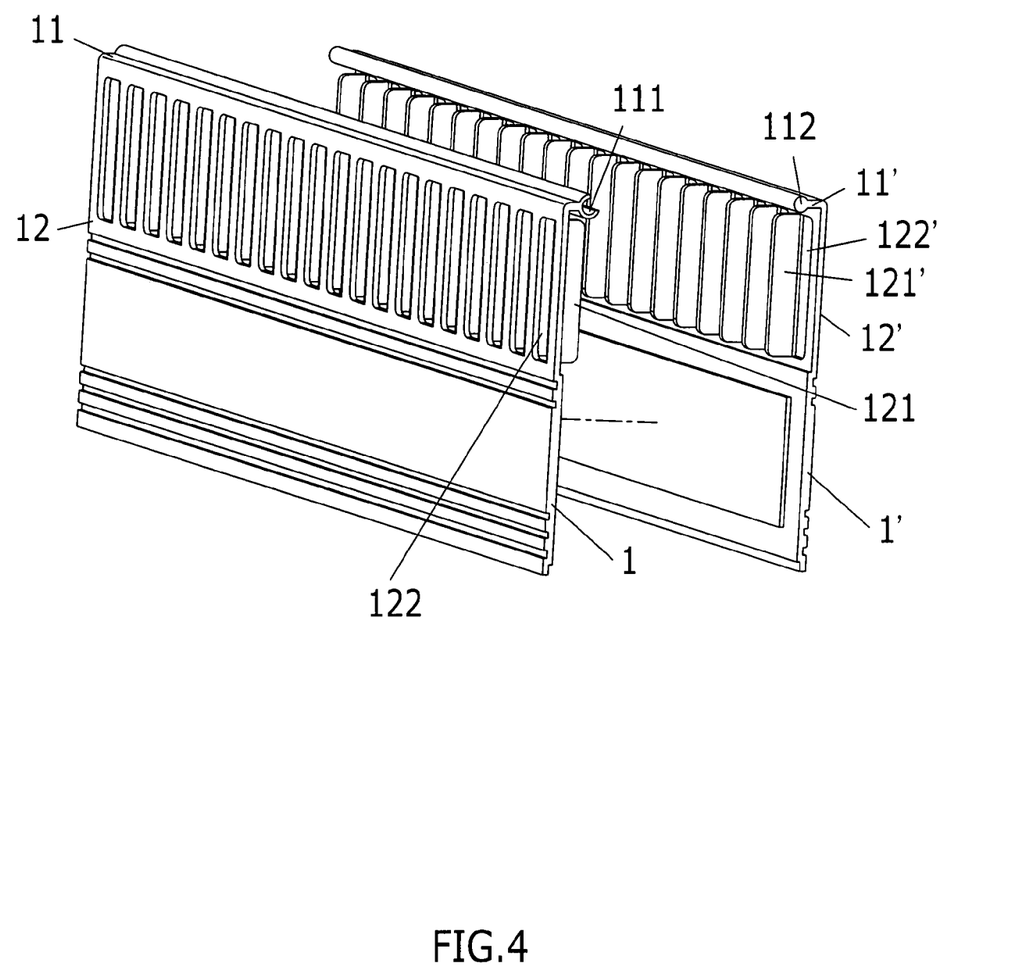
FIG. 4 is an exploded view to show a second embodiment of the first and second parts of the cooling device of the present invention.
Figure 5:
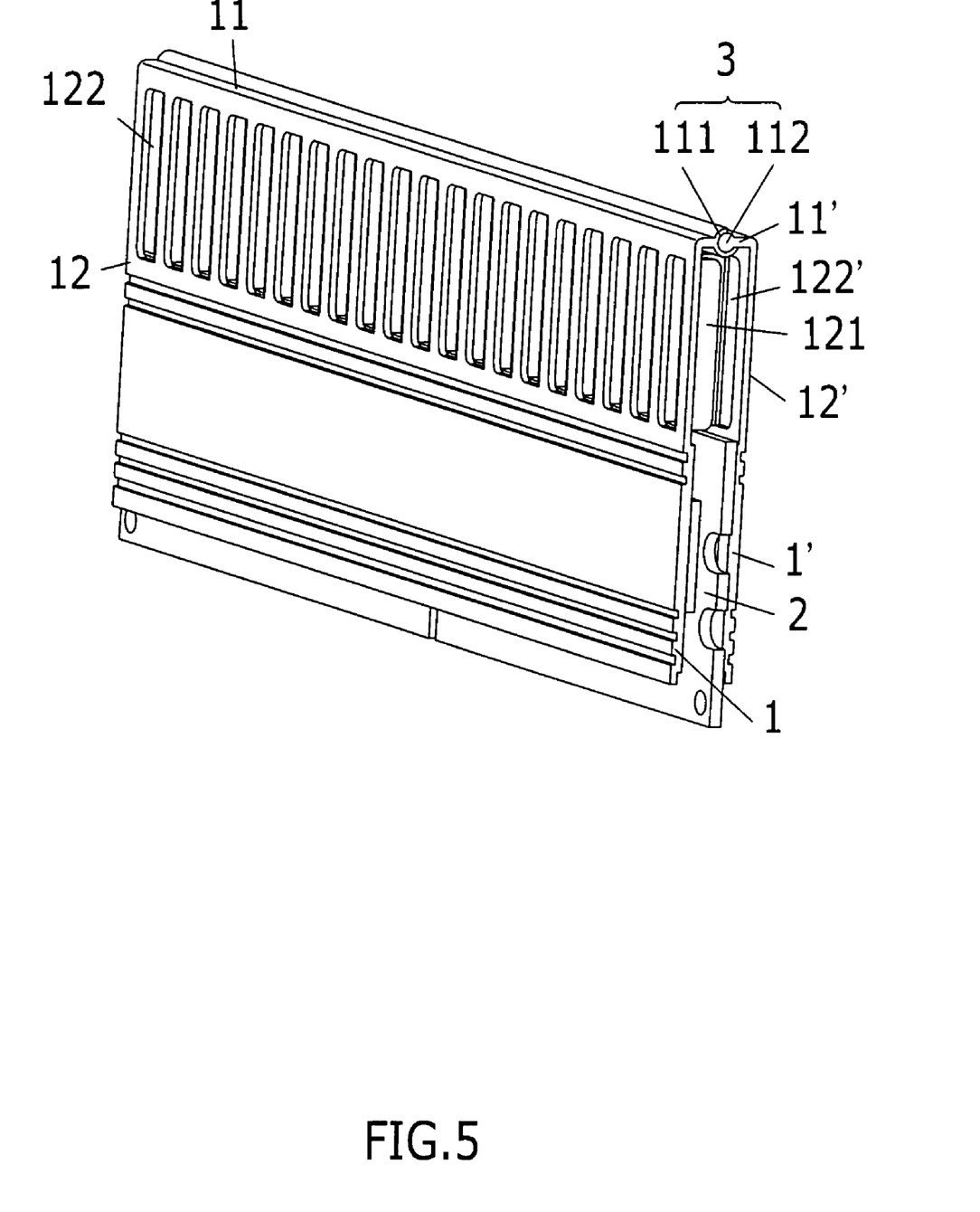
FIG. 5 is a perspective view to show a memory chip is sandwiched between the first and second parts disclosed in FIG. 4.

FIGS. 4 and 5 show a second embodiment of the present invention wherein the first elongate plate includes a first operation section 12 which is located beneath the first flange 11 and includes a plurality of first fins 121 extending from an inside of the first operation section 12. A plurality of first ventilation holes 122 are defined between the first fins 121. The second elongate plate includes a second operation section 12' which is located beneath the second flange 11' and includes a plurality of second fins 121' extending from an inside of the second operation section 12'. A plurality of second ventilation holes 122' are defined between the second fins 121'. The first fins 121 and the second fins 121' are alternatively arranged when the first and second operation sections 12, 12' are moved toward each other to sandwich the memory chip 2. The first and second fins 121, 121' provide large area for removing the heat and the first and second ventilation holes 122, 122' introduce sufficient air flow to remove the heat.

Figure 6:
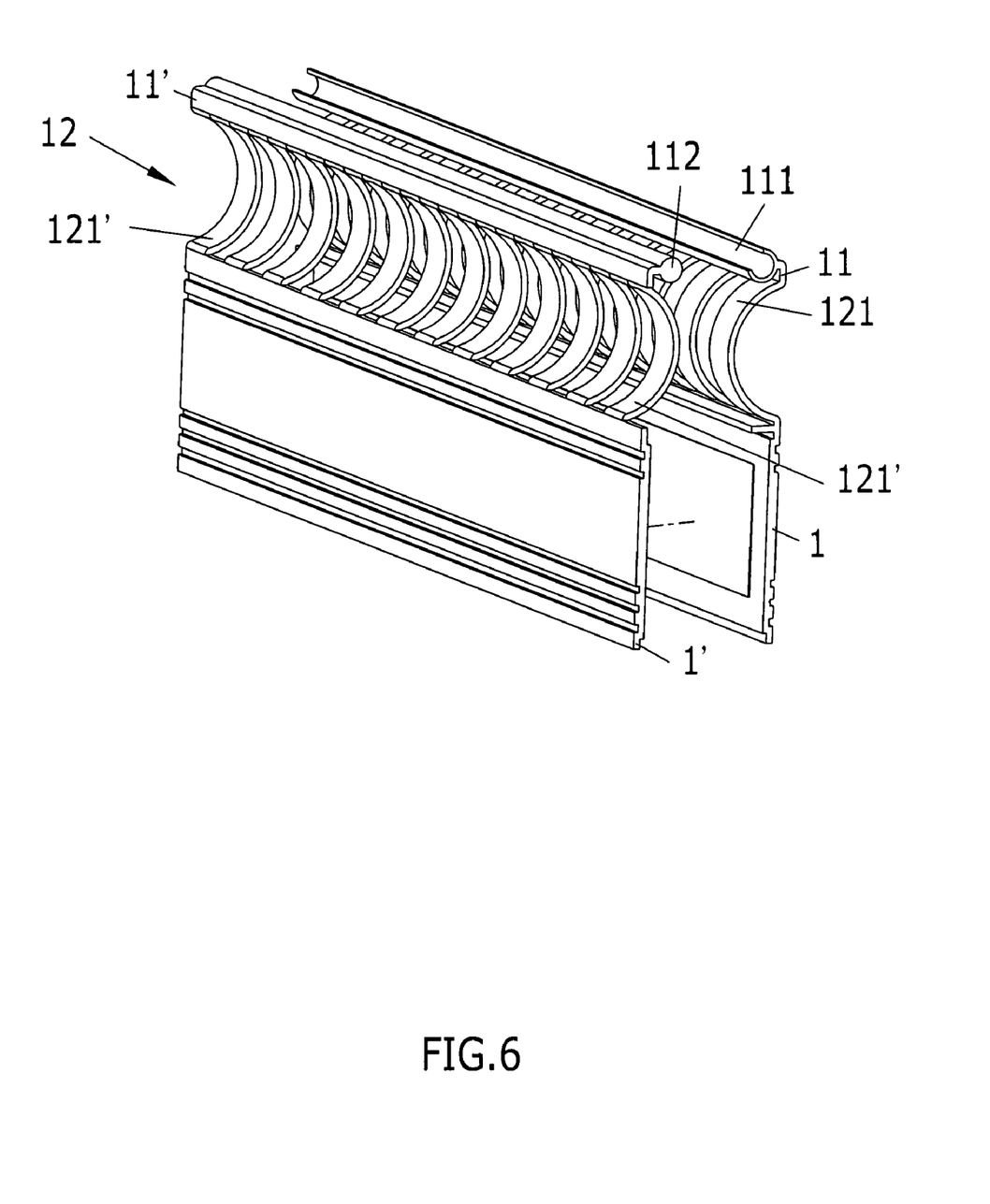
FIG. 6 is an exploded view to show a third embodiment of the first and second parts of the cooling device of the present invention.
Figure 7:
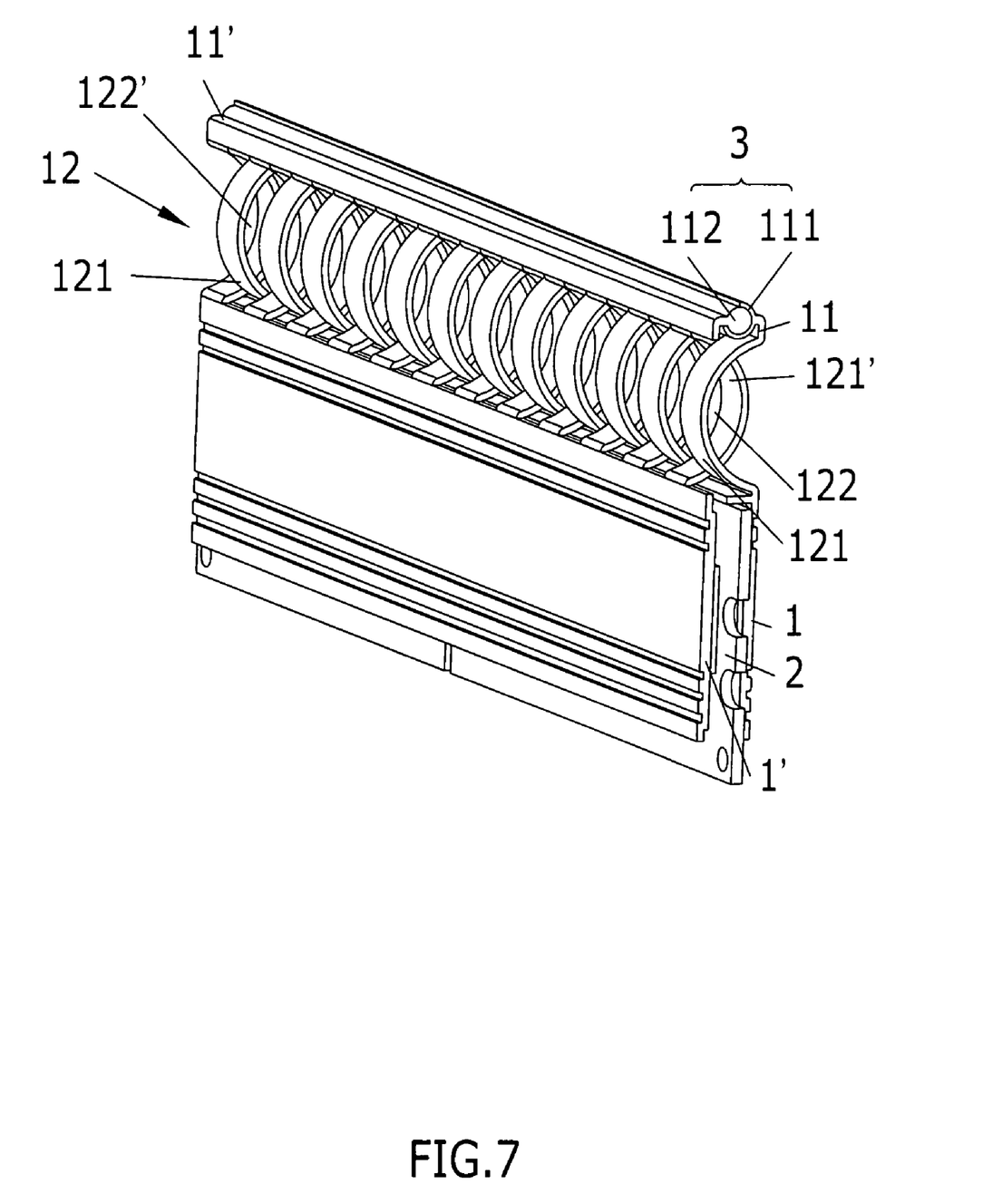
FIG. 7 is a perspective view to show a memory chip is sandwiched between the first and second parts disclosed in FIG. 6.

FIGS. 6 and 7 show a third embodiment of the present invention and the third embodiment is amended from the second embodiment, wherein the first and second operation sections 12, 12' each are composed of a plurality of curved fins 121/121'. The first curved fins 121 and the second curved fins 121' curve toward each other. First and second ventilation holes 122, 122' are defined between the first and second curved fins 121, 121' which extend through the second and first ventilation holes 122'. 122 when the first and second parts 1, 1' are connected to each other to sandwich the memory chip 2 between the first and second parts 1, 1'.

The memory chip 2 is easily sandwiched between or removed from the first and second parts 1, 1' simply by pivoting the first and second parts 1, 1' about the pivot assembly 3.

While we have shown and described the embodiment in accordance with the present invention, it should be clear to those skilled in the art that further embodiments may be made without departing from the scope of the present invention.

What is claimed is:

1. A cooling device for memory chip, comprising:
    a first part having a first elongate plate and a first flange extending laterally from a top of the first elongate plate, a groove defined in an edge of the first flange, the first elongate plate including a first operation section which is located beneath the first flange and includes a plurality of first fins extending from an inside of the first operation section, first ventilation holes defined between the first fins;
    a second part having a second elongate plate and a second flange extending laterally from a top of the second elongate plate, a lip end connected to an edge of the second flange, the lip end being pivotably engaged with the groove, the second elongate plate including a second operation section which is located beneath the second flange and includes a plurality of second fins extending from an inside of the second operation section, second ventilation holes defined between the second fins, and
    a memory chip being sandwiched between the first and second elongate plates of the first and second parts.

2. The device as claimed in claim 1, wherein the first fins and the second fins are alternatively arranged when the first and second operation sections are moved toward each other to sandwich the memory chip.

3. The device as claimed in claim 1, wherein the first and second operation sections each are composed of a plurality of curved fins, the first curved fins and the second curved fins curve toward each other.

* * * * *